US011978865B2

(12) United States Patent
Kim et al.

(10) Patent No.: US 11,978,865 B2
(45) Date of Patent: May 7, 2024

(54) BATTERY CELL THERMAL CONDUCTIVITY MEASUREMENT DEVICE AND BATTERY CELL THERMAL CONDUCTIVITY MEASUREMENT METHOD USING SAME

(71) Applicant: LG CHEM, LTD., Seoul (KR)

(72) Inventors: Kwang Min Kim, Daejeon (KR); Woo Young Song, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 367 days.

(21) Appl. No.: 17/289,197

(22) PCT Filed: Jun. 4, 2020

(86) PCT No.: PCT/KR2020/007270
§ 371 (c)(1),
(2) Date: Apr. 27, 2021

(87) PCT Pub. No.: WO2020/256316
PCT Pub. Date: Dec. 24, 2020

(65) Prior Publication Data
US 2021/0344056 A1    Nov. 4, 2021

(30) Foreign Application Priority Data
Jun. 18, 2019   (KR) .................. 10-2019-0072383

(51) Int. Cl.
*H01M 10/42* (2006.01)
*G01N 25/18* (2006.01)
(Continued)

(52) U.S. Cl.
CPC ........ *H01M 10/4285* (2013.01); *G01N 25/18* (2013.01); *G01N 25/4826* (2013.01);
(Continued)

(58) Field of Classification Search
None
See application file for complete search history.

(56) References Cited

U.S. PATENT DOCUMENTS 4,630,938 A * 12/1986 Piorkowska-Palczewska ............. G01N 25/18 374/43
6,218,843 B1 * 4/2001 Zimmerman ........ G01R 31/385 324/426

(Continued)

FOREIGN PATENT DOCUMENTS

CN  204228639 U  3/2015
CN  106198618 A  12/2016
(Continued)

OTHER PUBLICATIONS

Extended European Search Report dated Nov. 9, 2021 issued in corresponding European patent application No. 20825793.1.
(Continued)

*Primary Examiner* — Jas A Sanghera
(74) *Attorney, Agent, or Firm* — Morgan, Lewis & Bockius LLP

(57) ABSTRACT

The present invention relates to a device for measuring the thermal characteristics of a pouch-type battery cell, specifically, the thermal conductivity of the battery cell, and a thermal conductivity measurement method using the same. When the battery cell thermal conductivity measurement device of the present invention is used, the thermal conductivity of a pouch-type battery cell exhibiting anisotropic thermal conductivity characteristics can be separated along each direction and measured, and thereby stability according to the thermal characteristics of a product, which uses a battery cell for a rechargeable battery, can be efficiently evaluated.

5 Claims, 6 Drawing Sheets

(51) Int. Cl.
  *G01N 25/48* (2006.01)
  *H01M 10/48* (2006.01)
  *H01M 50/105* (2021.01)
  *H01M 50/116* (2021.01)
(52) U.S. Cl.
  CPC ....... *H01M 10/486* (2013.01); *H01M 50/105* (2021.01); *H01M 50/116* (2021.01)

(56) References Cited

U.S. PATENT DOCUMENTS

| | | | |
|---|---|---|---|
| 6,435,868 B2 * | 8/2002 | White | H01L 21/67748 432/5 |
| 10,041,894 B1 | 8/2018 | Alam et al. | |
| 2014/0142884 A1 * | 5/2014 | Ahmad | G01K 17/20 702/136 |
| 2020/0088587 A1 * | 3/2020 | Sato | G01K 5/52 |

FOREIGN PATENT DOCUMENTS

| | | |
|---|---|---|
| CN | 106872898 A | 6/2017 |
| CN | 108775971 A | 11/2018 |
| CN | 106053527 B | 2/2019 |
| DE | 102007039365 A1 | 2/2009 |
| JP | H07-209222 A | 8/1995 |
| JP | 2002-166167 A | 6/2002 |
| JP | 2005-227010 A | 8/2005 |
| JP | 2012-032231 A | 2/2012 |
| JP | 2013-011563 A | 1/2013 |
| JP | 2013-19712 A | 1/2013 |
| JP | 2013-088258 A | 5/2013 |
| KR | 200334651 Y1 | 11/2003 |
| KR | 10-2011-0012750 A | 2/2011 |
| KR | 10-2012-0063687 A | 6/2012 |
| KR | 20130028377 A | 3/2013 |
| KR | 20130028470 A | 3/2013 |
| KR | 101706251 B1 | 2/2017 |
| KR | 10-1767445 B1 | 8/2017 |
| WO | 2013/001950 A1 | 1/2013 |
| WO | 2018/220153 A1 | 12/2018 |

OTHER PUBLICATIONS

[Thermal property measurement and application] Insulation material thermal conductivity evaluation technology, Hellot magazine article, Feb. 26, 2019, pp. 1-9 http://magazine.hellot.net/magz/article/articleDetail.do?flag=all&showType=showType1&articleId=ARTI_000000000035816&articleAllListSortType . . . .
Dubois et al., "Design, Construction and Validation of a Guarded Hot Plate Apparatus for Thermal Conductivity Measurement of High Thickness Crop Based Specimens", Materials and structures, 2013, pp. 1-21.
Lee et al., "Experimental Study on Correction of Thermal Conductivity Obtained by Heat Flow Method using Commercial Guarded Hot Plate Method Apparatus", Journal of Ocean Engineering and Technology 29(2), 169-174 Apr. 2015.
International Search Report (with partial translation) and Written Opinion dated Sep. 11, 2020 issued in corresponding International Patent Application No. PCT/KR2020/007270.
Office Action issued in the corresponding Japanese Patent Application No. 2021-524443 dated Jun. 6, 2022.
Office Action issued in corresponding European Patent Application No. 20825793.1 dated Jan. 24, 2023.
Office Action issued in Chinese Patent Application No. 202080005947.5 dated Feb. 24, 2024.

* cited by examiner

【FIG. 1】
-- Prior Art --
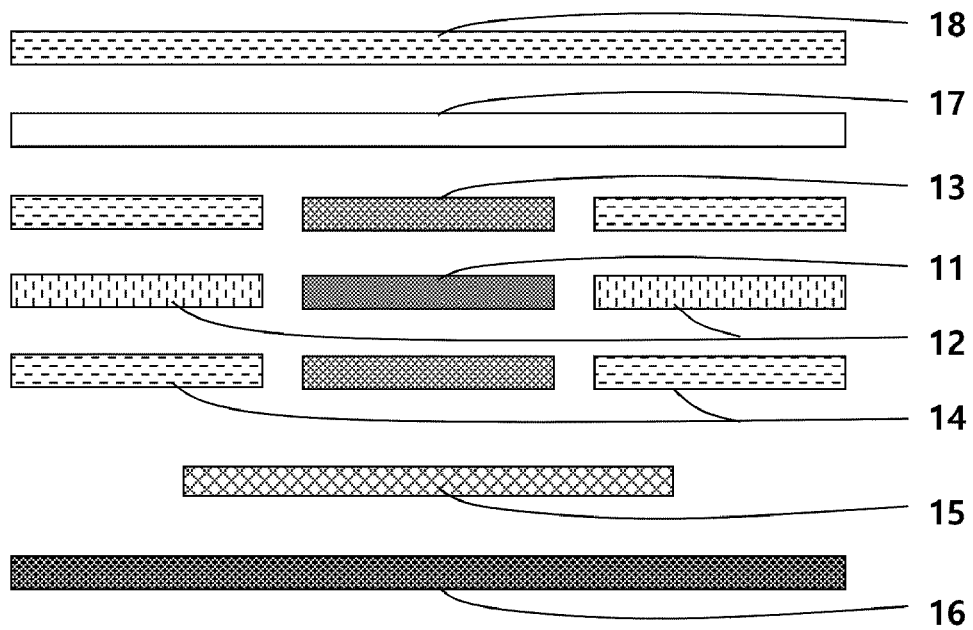

[FIG. 2]
-- Prior Art --
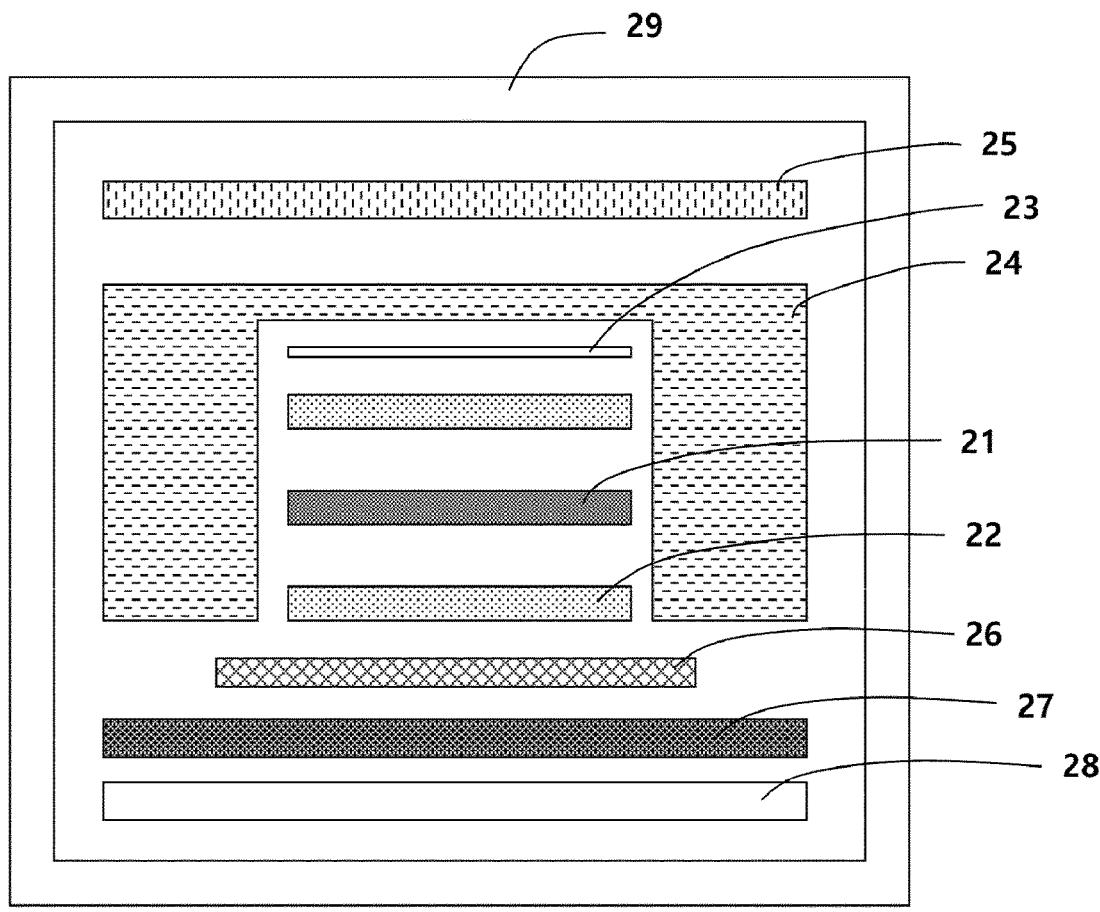

[FIG. 3]
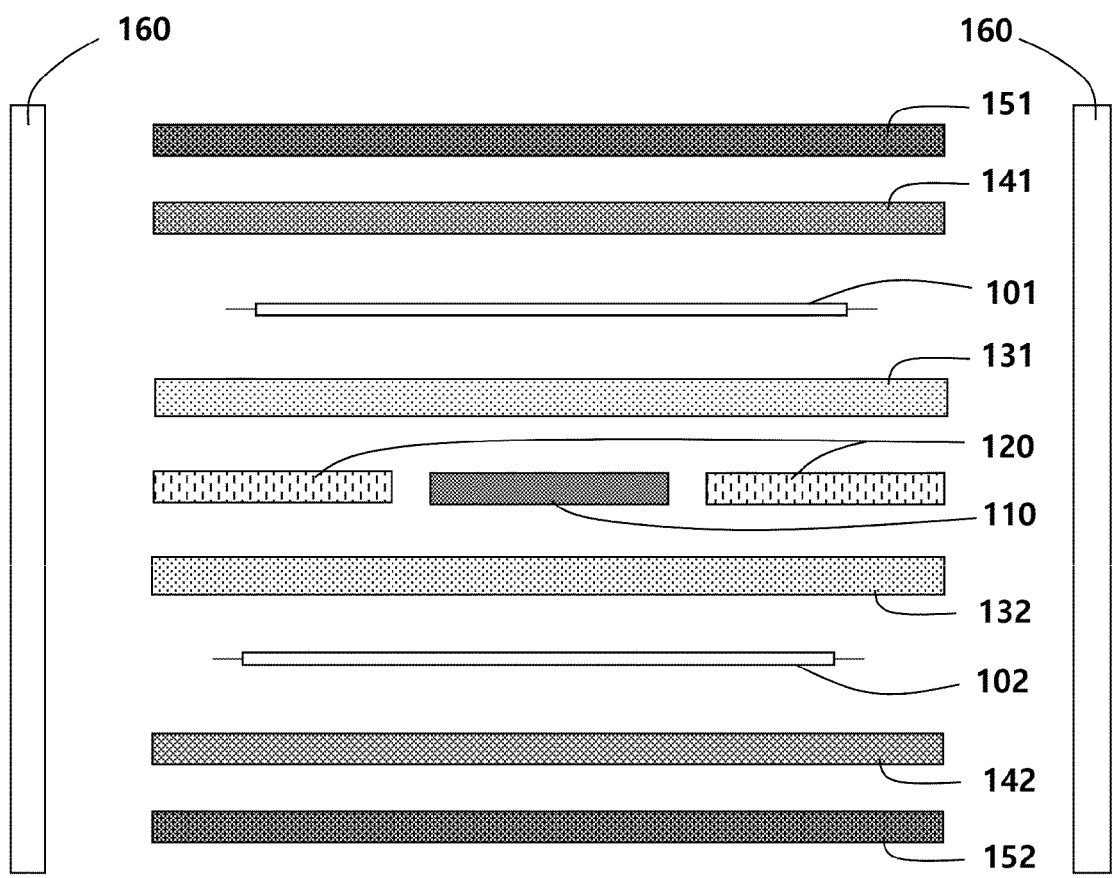

[FIG. 4]
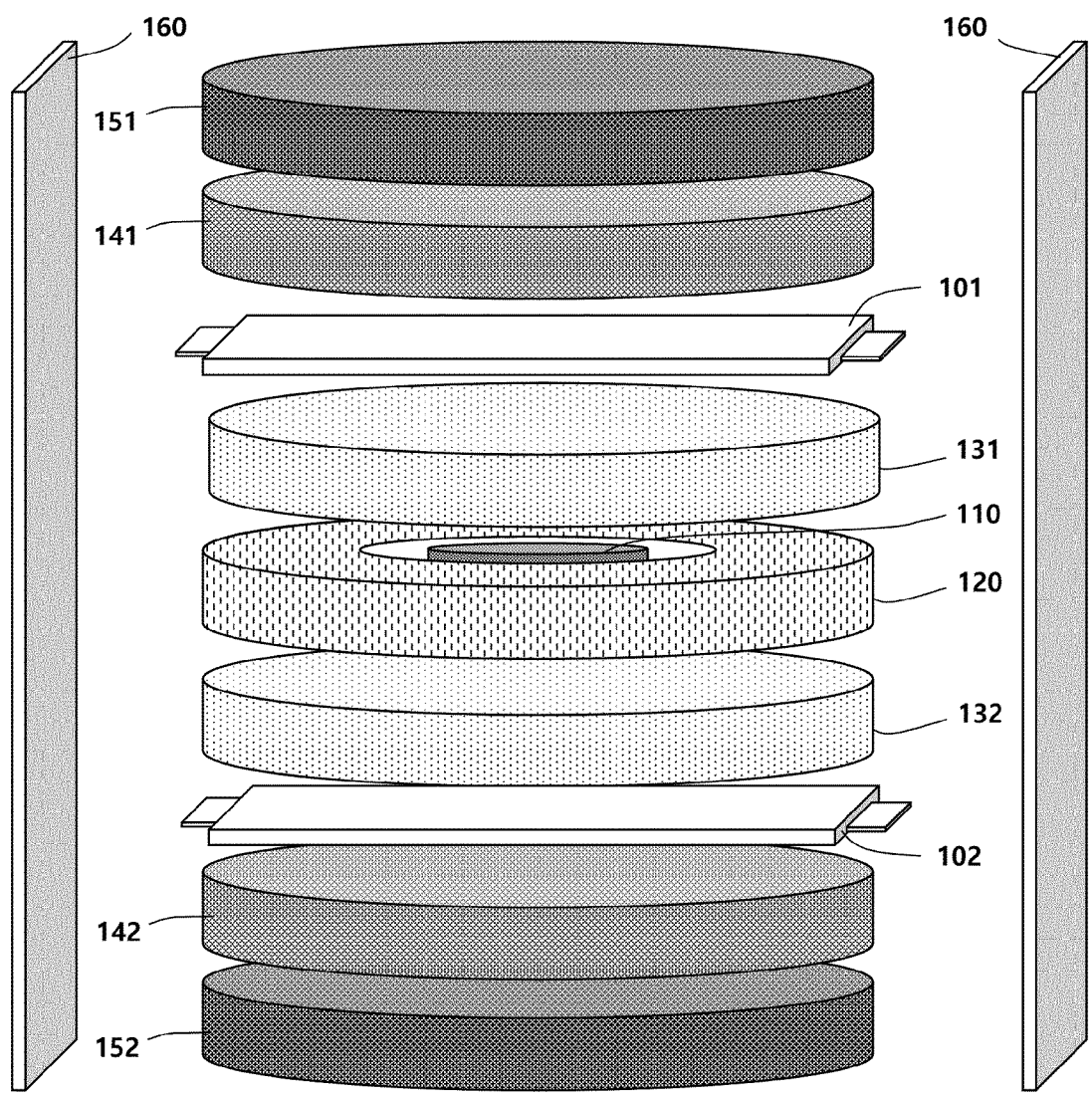

[FIG. 5]
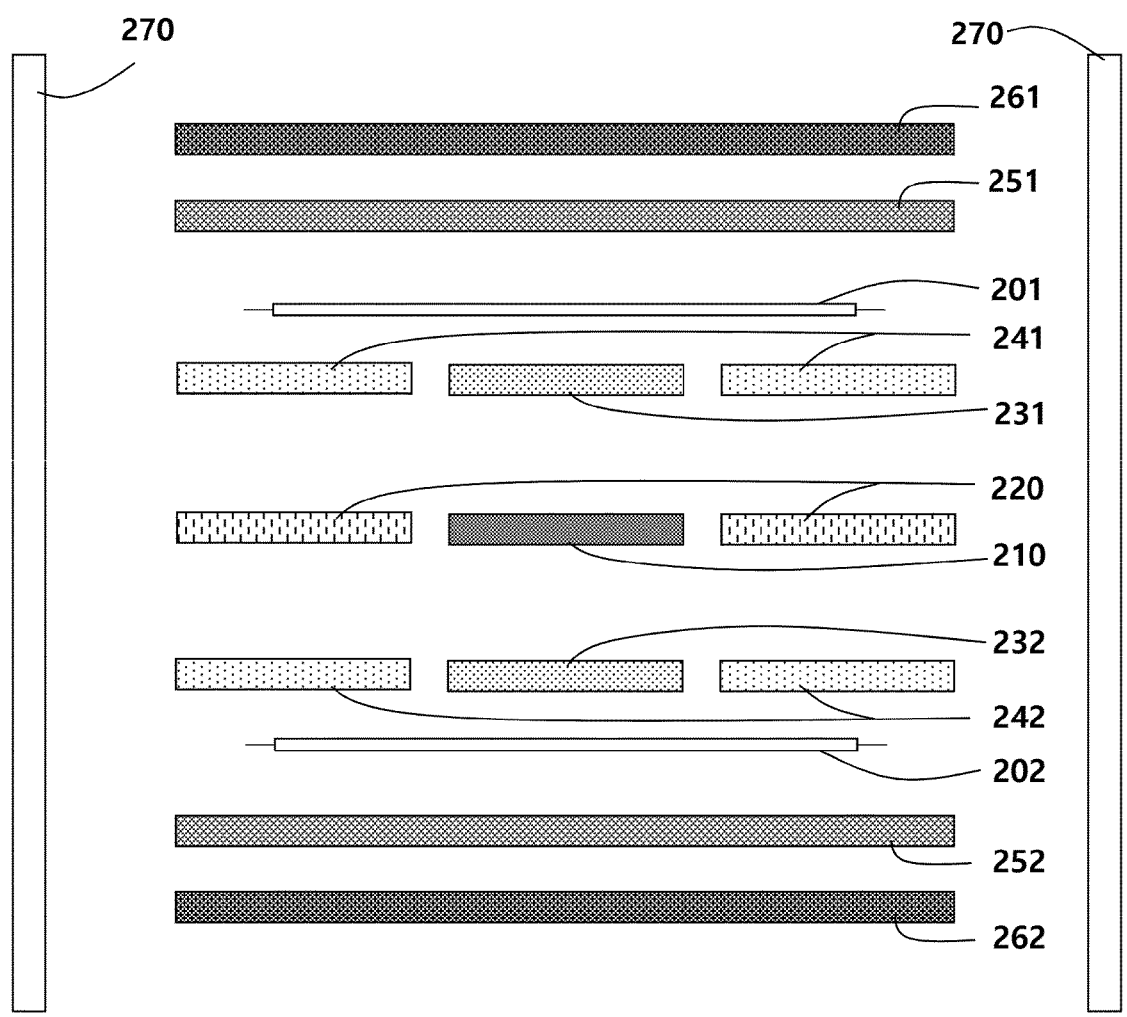

[FIG. 6]
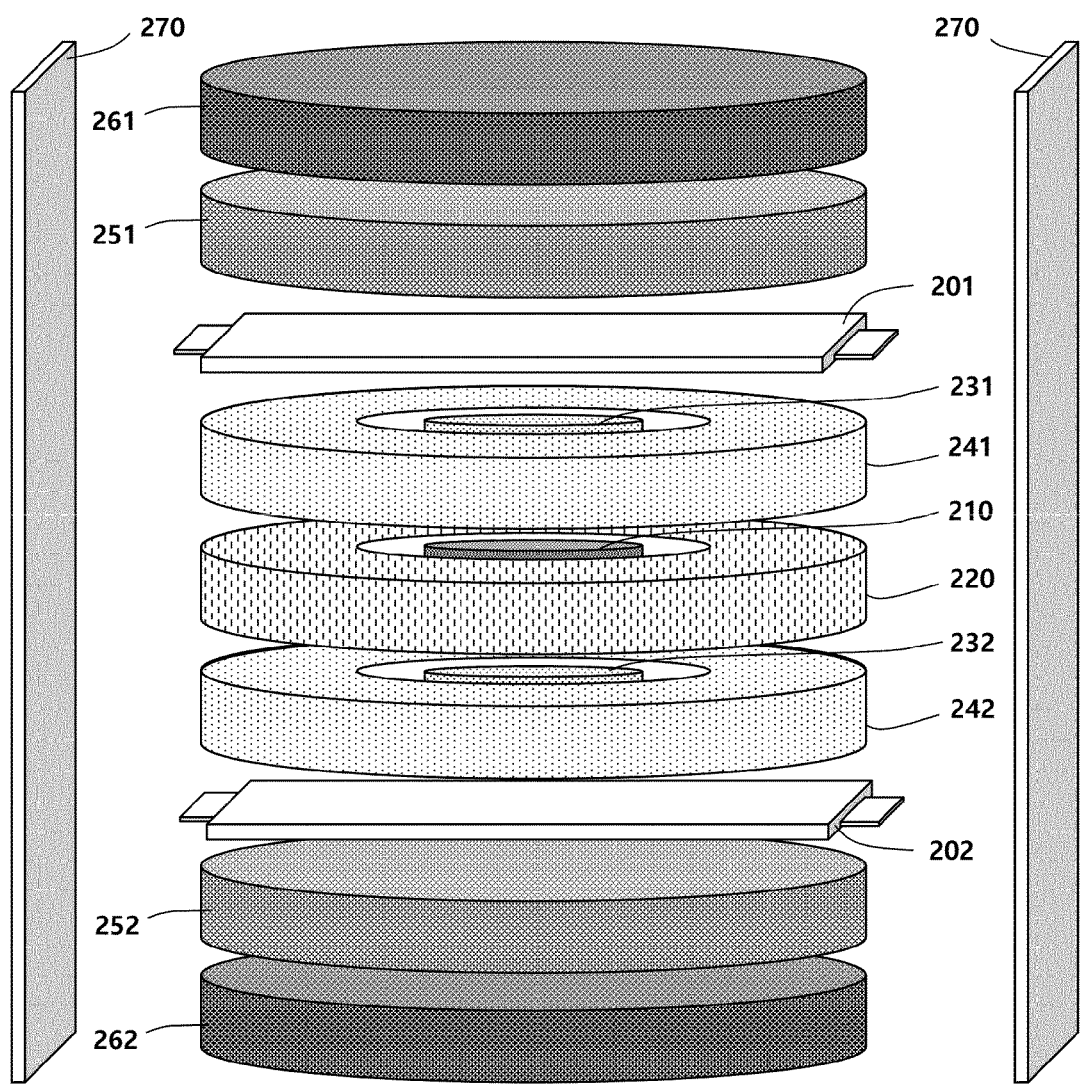

BATTERY CELL THERMAL CONDUCTIVITY MEASUREMENT DEVICE AND BATTERY CELL THERMAL CONDUCTIVITY MEASUREMENT METHOD USING SAME

TECHNICAL FIELD

The present invention relates to an apparatus for measuring a thermal property of a pouch type battery cell, and specifically the thermal conductivity of a battery cell, and a method for measuring the thermal conductivity using the same.

This application claims the benefit of priority based on Korean Patent Application No. 10-2019-0072383, filed on Jun. 18, 2019, and the entire contents of the Korean patent application are incorporated herein by reference.

BACKGROUND ART

As the price of energy sources increases due to depletion of fossil fuels and the interest in environmental pollution increases, the demand for environmentally friendly alternative energy sources becomes an indispensable factor for future life. Especially, as technology development and demand for mobile devices are increasing, demand for secondary batteries as energy sources is rapidly increasing.

Typically, in terms of the shape of the battery, there is a high demand for a prismatic secondary battery and a pouch-type secondary battery that can be applied to products such as mobile phones with a small thickness. In terms of materials, there is a high demand for lithium secondary batteries such as lithium ion batteries and lithium ion polymer batteries having high energy density, discharge voltage, and output stability.

In recent years, a pouch type battery having a stack type or stack/folding type electrode assembly embedded in a pouch-shaped battery case of an aluminum laminate sheet has attracted a lot of attention due to its low manufacturing cost and small weight, and the amount used thereof is gradually increasing.

The pouch-type battery cell accommodates a stacked or stack-folding electrode assembly manufactured by stacking a positive electrode, a separator, and a negative electrode. Each positive electrode and negative electrode are electrically connected by electrode tabs, and electrode leads that are drawn out are connected to the electrode tabs.

The electrode assembly to which the electrode tab and the electrode lead are connected is stored in a pouch-shaped battery case, and then electrolyte is injected. A pouch type battery cell is manufactured by sealing a battery case while a part of the electrode lead is exposed to the outside.

On the other hand, the battery case of the pouch-type battery cell is made of a pouch shape and is easy to process, so there are few restrictions according to the size or shape of the electrode assembly, and the space inside the battery cell can be efficiently used. Therefore, the pouch-type battery cell has a high energy density and can be processed in various forms, and has recently been used in mobile devices and automobile batteries in various forms. However, since the pouch-type battery cell is applied with a high energy density ranging from a small device to a large device, a temperature rise may occur inside the device. Since this temperature rise affects the performance of the device itself or causes a risk of fire, explosion, etc., it is important to grasp the flow of heat discharged from the battery cell, that is, the thermal conductivity of the battery cell.

The thermal conductivity refers to a value indicating the degree of heat conduction in an object, and is a value obtained by dividing the amount of heat flowing in a unit time past a unit area perpendicular to the flow of heat by a difference in temperature per unit length. Therefore, it means that the higher the thermal conductivity, the better the heat is passed, and in general, metals have high thermal conductivity.

As methods for measuring the thermal conductivity, a hot wire method, a guarded heat flow method, and a guarded hot plate method are known. Among them, the guarded hot plate method is a method for measuring the thermal conductivity of a solid sample (specimen) and is performed according to a principle of measuring the thermal conductivity by measuring the amount of heat flowing from the high temperature side to the low temperature side while accurately measuring the temperature on both sides of the sample. That is, an auxiliary hot plate called a guarded hot plate is disposed around a hot plate so that heat flow can be accurately formed in one dimension in the sample, so that the hot plate has a constant temperature. In addition, the heat should be moved in the direction perpendicular to the surface of the plate to calculate the correct thermal conductivity.

Therefore, the hot plate and the guarded hot plate are disposed in a state that is spaced apart by a certain distance, and sometimes the space between them is filled with a material having low thermal conductivity.

Various structures have also been studied regarding the guarded hot plate method, and in addition to a conventional method of calculating and measuring a heat flow by placing a test piece between each of the hot plate and the cooling plate, a so-called two-piece method structure, which forms a symmetrical structure up and down around the hot plate, is also used.

However, the conventional guarded hot plate method is designed only for the measurement of a simple type of test piece made of a single material. The two-piece method also differs in that it measures the heat flow in the upward and downward directions using two test pieces, but it is the same as the conventional method, except that the accuracy is increased by averaging the thermal conductivities in the upward and downward directions, and is basically not different from the conventional method in that it targets a single material having one-sided thermal conductivity.

However, in the case of a pouch type battery cell, unlike the test piece of a single material, it contains various materials with different properties such as positive electrode and negative electrode current collectors, separators, electrode mixtures, and battery cases, and the arrangement of each material is not evenly distributed. Hence, it is different from single material specimen.

Therefore, since it is difficult to evaluate the thermal characteristics of a battery cell using the conventional guarded hot plate method and apparatus, a new apparatus and method are needed.

DISCLOSURE

Technical Problem

An object of the present invention is to provide an apparatus for independently measuring the thermal conductivity of a battery cell that exhibits anisotropy in each direction and a measuring method using the same, by improving a conventional thermal conductivity measuring apparatus and measuring method in which it is difficult to measure the thermal characteristics of the battery cell.

Technical Solution

In order to achieve the above object, an apparatus for measuring thermal conductivity of a battery cell according to the present invention may include: a hot plate including a heating element; and a guarded hot plate surrounding the hot plate, which is spaced from a side of the hot plate.

In addition, a measuring plate, a cooling plate, and a cooling unit may be sequentially provided at upper and lower parts respectively in a direction perpendicular to the hot plate and in a direction away from the hoy plate,
In this case, the measuring plate, the cooling plate, and the cooling unit respectively disposed in the upper and lower directions of the hot plate have a symmetrical structure about the hot plate, and one battery cell may be disposed between the upper and lower measuring plates and the cooling plate to measure thermal conductivity.

On the other hand, the guarded hot plate is for inducing the heat transfer direction of the hot plate linearly in the vertical direction on the basis of the hot plate in one dimension and is characterized in that it is maintained at a temperature equal to or higher than that of the hot plate so that the heat generated from the hot plate is not moved to the side.

The thickness of the measuring plate is characterized in that it increases in proportion to the amount of heat generated in the hot plate. The measuring plate may have a heat tendency to a high temperature surface closer to the hot plate and a low temperature surface closer to the cooling plate. As the distance between the high temperature surface and the low temperature surface increases, heat flow tends to be uniform. However, since the heat loss increases as the thickness increases, it is necessary to adjust the thickness to an appropriate thickness according to the amount of heat.

It is preferable that the measuring plate is made of a metal material having excellent thermal conductivity and a well-known reference value. Specifically, the measuring plate is preferably a metal or metal alloy having a thermal conductivity of 50 W/m·K or more, and more specifically, is characterized by comprising a metal material that is aluminum, copper, or an alloy thereof.

Further, according to another embodiment of the present invention, a guarded measuring plate surrounding the measuring plate at a position spaced apart from the measuring plate on the side of the measuring plate may be further included, in which case heat loss in the measuring plate can be further reduced.

Meanwhile, in order to further reduce the heat loss to the side of the thermal conductivity measuring apparatus, a heat insulating member comprising a heat insulating material may be provided covering the side surfaces of the guarded hot plate, the measuring plates, the cooling plates, the cooling units, and the battery cells, in a spaced state so that direct heat transfer is not achieved through the insulating member so that direct heat transfer is not achieved through the heat insulating member.

The hot plate may be in the form of a cylinder or a cuboid. The shape of the hot plate is not limited, but in order to suppress heat loss in the lateral direction and promote one-dimensional heat transfer in the vertical direction, it may be rectangular or square, most preferably circular.

When the battery cell thermal conductivity measuring apparatus of the present invention is used, it is possible to separately measure the thermal conductivity of the battery cells, each of which exhibits different thermal characteristics in the upward and downward directions of the battery cell. Specifically, through the following steps, it is possible to separately measure upward and downward directions in the vertical direction.

a step of calculating an amount of heat applied to the battery cell in an upward direction perpendicular to a hot plate;

a step of calculating an amount of heat applied to the battery cell in a downward direction perpendicular to the hot plate; and a step of calculating a thermal conductivity of the battery cell by using the amount of heat applied in the upward direction and the amount of heat applied in the downward direction.

At this time, the amount of heat applied to the battery cell in the upward direction perpendicular to the hot plate may be calculated by Equation 1 below.

$$P_{up} = \frac{T_1 - T_2}{(T_1 - T_2) + (T_3 - T_4)} \times iV \qquad \text{[Equation 1]}$$

(In Equation 1 above, $P_{up}$ denotes an amount of heat applied to a battery cell in an upward energy integration. If heat is not efficiently discharged when high heat is generated in the secondary battery, a thermal runaway phenomenon may occur in the secondary battery itself, and it may have a bad influence depending on the thermal characteristics of the electronic device including the secondary battery. Therefore, it is very important to measure the thermal characteristics of the pouch-type battery cell.

However, in the case of a battery cell, unlike a material made of a single material, thermal conduction occurs anisotropically, and thus it is difficult to measure characteristics with a conventional thermal conductivity measuring device. In order to solve this problem, the thermal conductivity measuring apparatus of the present invention is characterized in that it is possible to separately measure a vertical thermal conductivity from the lower surface to the upper surface of the battery cell and a vertical thermal conductivity from the upper surface to the lower surface of the battery cell.

Through this, it is possible to accurately determine at what ratio the heat generated inside the battery cell is transferred to the upper and lower surfaces of the battery cell, and it is possible to prepare a design in a manner that optimizes the placed position and direction of the secondary battery in consideration of the thermal characteristics of the internal parts of the electronic product.

The apparatus for measuring thermal conductivity of the present invention includes a hot plate including a heating element; and a guarded hot plate surrounding the hot plate in a state spaced from the side of the hot plate.

In addition, a measuring plate, a cooling plate, and a cooling unit may be sequentially provided at upper and lower parts in a direction perpendicular to the hot plate, and the measuring plate, the cooling plate, and the cooling unit respectively disposed in the upper and lower directions of the hot plate have a symmetrical structure about the hot plate. Due to this structure, heat generated in the hot plate moves vertically from the hot plate to the cooling plate in the vertical direction.

In this case, one battery cell may be disposed between the upper and lower measuring plates and the cooling plate to measure thermal conductivity.

On the other hand, the guarded hot plate is for inducing the heat transfer direction of the hot plate linearly in the vertical direction on the basis of the hot plate in one dimension and is characterized in that it is maintained at a temperature equal to or higher than that of the hot plate so that the heat generated from the hot plate is not moved to the side. If the guarded hot plate is dropped to a lower temperature than the hot plate, it is difficult to accurately measure the thermal conductivity since heat transfer also occurs to the side due to the characteristic of moving from a high temperature to a low temperature.

The thickness of the measuring plate is characterized in that it increases in proportion to the amount of heat generated in the hot plate. The measuring plate may have a heat tendency to a high temperature surface closer to the hot plate and a low temperature surface closer to the cooling plate. As the distance between the high temperature surface and the low temperature surface increases, heat flow tends to be uniform. That is, the thicker the thickness of the measuring plate, the more precisely the thermal characteristics can be measured. However, since the heat loss increases as the thickness increases, it is necessary to adjust the thickness to an appropriate thickness according to the amount of heat generated from the hot plate.

It is preferable that the measuring plate comprises a metal material having excellent thermal conductivity and a well-known reference value. Specifically, as the material of the measuring plate, aluminum, copper, or alloys thereof may be selected and used. If the thermal conductivity is low, the heat loss increases as much, making it difficult to accurately measure the amount of heat.

On the other hand, the measuring plate is a component that is a standard for measuring thermal conductivity, and when calculating thermal conductivity, the temperatures of one surface close to the hot plate and the other surface close to the cooling plate are measured.

In addition, in order to minimize heat loss due to an increase in the thickness of the measuring plate, the measuring plate may be designed with a structure similar to that of the hot plate. According to another embodiment of the present invention, a guarded measuring plate surrounding the measuring plate at a position spaced apart from the measuring plate on the side of the measuring plate may be further included, in which case heat loss in the measuring plate can be further reduced.

In order to further reduce the heat loss to the side of the thermal conductivity measuring apparatus, a heat insulating member comprising a heat insulating material may be provided covering the side surfaces of the guarded hot plate, the measuring plates, the cooling plates, the cooling units, and the battery cells, in a spaced state so that direct heat transfer is not achieved through the insulating member.

When the thermal conductivity measuring apparatus includes a guarded measuring plate, a heat insulating member comprising a heat insulating material may be provided covering the side surfaces of the guarded hot plate, the guarded measuring plates, the cooling plates, the cooling units, and the battery cells, in a spaced state so that direct heat transfer is not achieved through the insulating member.

The hot plate may be in the form of a cylinder or a cuboid. The shape of the hot plate is not limited, but in order to suppress heat loss in the lateral direction and promote one-dimensional heat transfer in the vertical direction, it may be rectangular or square, most preferably circular.

When the battery cell thermal conductivity measuring apparatus of the present invention is used, it is possible to separately measure the thermal conductivity of the battery cells, each of which exhibits different thermal characteristics in the upward and downward directions of the battery cell. Specifically, through the following steps, it is possible to separately measure upward and downward directions in the vertical direction.

a step of calculating an amount of heat applied to the battery cell in an upward direction perpendicular to the hot plate;

a step of calculating an amount of heat applied to the battery cell in a downward direction perpendicular to the hot plate;

a step of calculating a thermal conductivity of the battery cell by using the amount of heat applied in the upward direction and the amount of heat applied in the downward direction.

Among conventional guarded hot plate methods, a two-piece method is performed based on a principle that forms a constant heat flux in the vertical direction of the main hot plate while the temperatures of the main hot plate and the auxiliary hot plate are set to be the same. Accordingly, the size of the auxiliary hot plate should be very large, and the auxiliary hot plate should be maintained at the same temperature as that of the hot plate. Also, assuming that the upper and lower test pieces have the same material and material conductivity, the calorific value is obtained as the average of the conductivity in the upward and downward directions. Therefore, it is suitable for measuring the thermal properties of an isotropic material or a heat insulating material having a uniform thermal conductivity, but the thermal conductivity of a pouch-type battery cell cannot be measured by this method.

Therefore, in the thermal conductivity measuring apparatus of the present invention, the measuring plate is disposed above and below the hot plate to separately measure the amount of heat in the upward direction and the amount of heat in the downward direction. In addition, the hot plate should be made large in correspondence with the size of the battery cell, but the guarded hot plate may be made relatively small as the measuring plate is disposed, and the temperature of the guarded hot plate can be maintained at a temperature higher than that of the hot plate, so adjustment is easy.

The measuring principle of the thermal conductivity measuring apparatus is as follows.

The total amount of heat generated from the hot plate can be expressed as the product of current and voltage, which is equal to the sum of the amount of heat in the upward direction and the amount of heat in the downward direction.

On the other hand, by using the surface temperature of the upper measuring plate and the lower measuring plate, it is possible to obtain the ratio of heat applied to each of the vertical direction. The thermal conductivities in the upward and downward directions of the battery cell can be obtained, respectively, by using this, and the ratio can also be easily calculated.

First, the amount of heat applied to the battery cell in the upward direction perpendicular to the hot plate may be calculated by Equation 1 below.

$$P_{up} = \frac{T_1 - T_2}{(T_1 - T_2) + (T_3 - T_4)} \times iV \quad \text{[Equation 1]}$$

(In Equation 1 above, $P_{up}$ denotes an amount of heat applied to a battery cell in a upward direction, $T_1$ denotes a temperature of one surface facing a hot plate of a measuring plate placed on a top of the hot plate, $T_2$ denotes a temperature of the other surface facing the battery cell of the measuring plate placed on the top of the hot plate, $T_3$ denotes a temperature of one surface facing the hot plate of the measuring plate disposed under the hot plate, $T_4$ denotes a temperature of the other surface facing the battery cell of the measuring plate placed under the hot plate, i denotes a current applied to the hot plate, and V denotes a voltage applied to the hot plate.)

Next, the amount of heat applied to the battery cell in a downward direction perpendicular to the hot plate may be calculated by Equation 2 below.

$$P_{down} = \frac{T_3 - T_4}{(T_1 - T_2) + (T_3 - T_4)} \times iV \quad \text{[Equation 2]}$$

(In Equation 2 above, $P_{down}$ denotes an amount of heat applied to a battery cell in a downward direction, $T_1$ denotes a temperature of one surface facing a hot plate of a measuring plate placed on a top of the hot plate, $T_2$ denotes a temperature of the other surface facing the battery cell of the measuring plate placed on the top of the hot plate, $T_3$ denotes a temperature of one surface facing the hot plate of the measuring plate disposed under the hot plate, $T_4$ denotes a temperature of the other surface facing the battery cell of the measuring plate placed under the hot plate, i denotes a current applied to the hot plate, and V denotes a voltage applied to the hot plate.)

The thermal conductivity of the battery cell may be calculated by using the calorific values respectively calculated. The thermal conductivity calculation factors according to Equations 3 and 4 below are shown below.

First, the value of the amount of the heat applied in the upward direction, the thermal conductivity in the upward direction of the battery cell may be calculated by Equation 3 below.

$$k_{up} = \frac{P_{up} \times L_{top}}{A \times (T_H - T_C)} \quad \text{[Equation 3]}$$

(In the Equation 3, $k_{up}$ denotes a vertical thermal conductivity from a bottom to a top of a battery cell, $P_{up}$ denotes an amount of heat applied to the battery cell in an upward direction, $L_{top}$ denotes a thickness of a battery cell, A denotes a unit area for measuring an amount of heat, $T_H$ denotes a temperature at a bottom of a battery cell close to a hot plate, and $T_C$ denotes a temperature at a top of a battery cell close to a cooling plate.)

Using the value of the amount of the heat applied in the downward direction, the thermal conductivity in the downward direction of the battery cell may be calculated by Equation 4 below.

$$k_{down} = \frac{P_{down} \times L_{bottom}}{A \times (T'_H - T'_C)} \quad \text{[Equation 4]}$$

(In the Equation 4, $k_{down}$ denotes a vertical thermal conductivity from a top to a bottom of a battery cell, $P_{down}$ denotes an amount of heat applied to the battery cell in a downward direction, $L_{bottom}$ denotes a thickness of a battery cell, A denotes a unit area for measuring an amount of heat, $T'_H$ denotes a temperature at a top of a battery cell close to a hot plate, and $T'_C$ denotes a temperature at a bottom of a battery cell close to a cooling plate.)

The thermal conductivity of an anisotropic battery cell can be calculated separately for each direction by using the $k_{up}$ and $k_{down}$ values, and the rate at which heat is transferred in each direction is also easily seen.

BRIEF DESCRIPTION OF THE DRAWINGS

FIG. 1 schematically shows a structure seen from the side of an apparatus for measuring thermal conductivity according to a conventional art.

FIG. 2 schematically shows a structure seen from the side of another apparatus for measuring thermal conductivity according to a conventional art.

FIG. 3 shows a structure seen from the side of an apparatus for measuring thermal conductivity according to an embodiment of the present invention.

FIG. 4 is a three-dimensional view of the structure of an apparatus for measuring thermal conductivity according to an embodiment of the present invention.

FIG. 5 shows a structure seen from the side of an apparatus for measuring thermal conductivity according to another embodiment of the present invention.

FIG. 6 is a three-dimensional view of the structure of an apparatus for measuring thermal conductivity according to another embodiment of the present invention.

Hereinafter, the structure of the thermal conductivity measuring apparatus of the present invention will be described in more detail with reference to each drawing.

FIG. 1 shows a conventional thermal conductivity measuring apparatus 10, which is provided with a hot plate 11, a guarded hot plate 12, a measuring plate 13, a guarded plate 14, a cooling plate 16, a heat insulating material 17, a guarded plate 18. Herein, a test piece 15 is disposed on the cooling plate 16. Since the heat generated from the hot plate 11 moves vertically towards the cooling plate 16, heat transfer from the top to the bottom of the test piece 15 occurs. Therefore, this method is applicable only to isotropic materials. In addition, since the heat loss to the side is large, it is possible to grasp the approximate thermal characteristics, but precise measurement is impossible. In addition, the measuring plate 13 does not directly measure the amount of heat generated in the hot plate 11, but serves as a heat insulating material for preventing heat loss in measuring the amount of heat. Therefore, the measuring apparatus 10 of FIG. 1 does not measure the surface temperature in the vertical direction of the measuring plate 13. On the other hand, the measuring plate provided in the measuring apparatus of the present invention is provided in a vertically symmetrical structure unlike a conventional measuring apparatus, and it does not serve as a heat insulating material, but it is used to calculate the amount of heat that moves in the vertical direction of the hot plate as the surface temperature of the measuring plate is directly measured.

FIG. 2 shows another conventional thermal conductivity measuring apparatus 20 which has been further improved compared to the thermal conductivity measuring apparatus 10 of FIG. 1. It includes a hot plate 21, a measuring plate 22, a measuring instrument 23, a guarded plate 24, a guarded hot plate 25, a cooling plate 27, a cooling unit 28 and a heat insulating member 29. A test piece 26 is disposed on the cooling plate 27, and the heat transfer occurs from top to bottom. The heat loss is more suppressed than the thermal conductivity measuring device 10 of FIG. 1. but likewise, only the thermal conductivity in one direction can be measured, so it is not suitable for measuring the thermal conductivity of the battery cell.

FIGS. 3 and 4 show an embodiment of the thermal conductivity measuring apparatus 100 of the present invention. The heat moves vertically upward and downward from the central hot plate 110, and the guarded hot plate 120 is spaced apart from the side of the hot plate 110 to prevent loss in the lateral direction. In addition, an upper measuring plate 131 and a lower measuring plate 132 are provided adjacent to the hot plate in the vertical direction, and the temperatures of the respective surfaces of the upper measuring plate 131 and the lower measuring plate 132 are measured, from which the ratio of the amount of heat transferred in the vertical direction can be checked. Next, an upper cooling plate 141 and a lower cooling plate 142 are disposed, and an upper cooling unit 151 and a lower cooling unit 152 are disposed adjacent thereto to thereby maintain a low temperature of the cooling plate. The upper battery cells 101 and the lower battery cell 102 are disposed in the upward direction and the downward direction, respectively, and the same type of battery cells should be disposed in the same direction in order to separately calculate the thermal conductivity from the lower surface to the upper surface direction and the thermal conductivity from the upper surface to the lower surface direction. Also, a heat insulating member 160 is disposed, covering the side surfaces of the guarded hot plate 120, the upper measuring plates 131, the lower measuring plates 132, the upper cooling plate 141, the lower cooling plate 142, the upper cooling unit 151, the lower cooling unit 152, the upper battery cell 101, and the lower battery cell 102, in a spaced state.

FIGS. 5 and 6 show another embodiment of the thermal conductivity measuring apparatus 200 of the present invention. The heat moves vertically upward and downward from the central hot plate 210, and the guarded hot plate 220 is spaced apart from the side surface of the hot plate 210 to prevent loss in the lateral direction. In addition, an upper measuring plate 231 and a lower measuring plate 232 are provided adjacent to the hot plate in the vertical direction, and the temperatures of the respective surfaces of the upper measuring plate 231 and the lower measuring plate 232 are measured, from which the ratio of the amount of heat transferred in the vertical direction can be checked. In addition, guarded measuring plates 241 and 242 are spaced apart from each side of the upper measuring plate 231 and the lower measuring plate 232, respectively. Through this, it is possible to further reduce the heat loss in the measuring plate, and it is possible to maintain the heat transfer characteristics uniformly. Next, an upper cooling plate 251 and a lower cooling plate 252 are disposed, and an upper cooling unit 261 and a lower cooling unit 262 are disposed adjacent thereto to thereby maintain a low temperature of the cooling plate. The upper battery cell 201 and the lower battery cell 202 are disposed in the upward direction and the downward direction, respectively, and the same type of battery cells should be disposed in the same direction in order to separately calculate the thermal conductivity from the lower surface to the upper surface direction and the thermal conductivity from the upper surface to the lower surface direction. Also, a heat insulating member 270 is disposed, covering the side surfaces of the guarded hot plate 220, the upper guarded measuring plate 241, the lower guarded measuring plate 242, the upper cooling plate 251, the lower cooling plate 252, the upper cooling unit 261, the lower cooling unit 262, the upper battery cell 201, and the lower battery cell 202, in a spaced state.

DESCRIPTION OF REFERENCE NUMERALS

10: thermal conductivity measuring apparatus
11: hot plate
12: guarded hot plate
13: measuring plate
14: guarded plate
15: test piece
16: cooling plate
17: heat insulating material
18: guarded plate
20: thermal conductivity measuring apparatus
21: hot plate
22: measuring plate
23: measuring instrument
24: guarded plate
25: guarded hot plate
26: test piece
27: cooling plate
28: cooling unit
29: heat insulating material
100: thermal conductivity measuring apparatus
101: upper battery cell
102: lower battery cell
110: hot plate
120: guarded hot plate
131: upper measuring plate
132: lower measuring plate
141: upper cooling plate
142: lower cooling plate
151: upper cooling unit
152: lower cooling unit
160: heat insulating member
200: thermal conductivity measuring apparatus
201: upper battery cell
202: lower battery cell
210: hot plate
220: guarded hot plate
231: upper measuring plate
232: lower measuring plate
241: upper guarded measuring plate
242: lower guarded measuring plate
251: upper cooling plate
252: lower cooling plate
261: upper cooling unit
262: lower cooling unit
270: heat insulating member

The invention claimed is:

1. A method for measuring thermal conductivity of a battery cell by using an apparatus, comprising:
    calculating an amount of heat applied to the battery cell in an upward direction perpendicular to a hot plate;
    calculating an amount of heat applied to the battery cell in a downward direction perpendicular to the hot plate; and
    calculating a thermal conductivity of the battery cell using the amount of heat applied in the upward direction and the amount of heat applied in the downward direction,
    wherein the apparatus comprising:
    a hot plate including a heating element; and
    a guarded hot plate surrounding the hot plate, which is spaced from a side of the hot plate,
    wherein the apparatus has symmetrical structure about the hot plate by sequentially including a measuring plate, a cooling plate, and a cooling unit on an upper part and a lower part of the hot plate, respectively, in a direction perpendicular to the hot plate, and in a direction away from the hot plate, and wherein a battery cell is disposed between the cooling plate and the measuring plate of the upper part and the lower part, respectively.

2. The method of claim 1, wherein the amount of heat applied to the battery cell in the upward direction perpendicular to the hot plate is calculated by Equation 1 below:

$$P_{up} = \frac{T_1 - T_2}{(T_1 - T_2) + (T_3 - T_4)} \times iV \qquad \text{[Equation 1]}$$

wherein in Equation 1 above, $P_{up}$ denotes an amount of heat applied to a battery cell in an upward direction, $T_1$ denotes a temperature of one surface facing a hot plate of a measuring plate placed on a top of the hot plate, $T_2$ denotes a temperature of the other surface facing the battery cell of the measuring plate placed on the top of the hot plate, $T_3$ denotes a temperature of one surface facing the hot plate of the measuring plate disposed under the hot plate, $T_4$ denotes a temperature of the other surface facing the battery cell of the measuring plate placed under the hot plate, i denotes a current applied to the hot plate, and V denotes a voltage applied to the hot plat.

3. The method of claim 1, wherein the amount of heat applied to the battery cell in the downward direction perpendicular to the hot plate is calculated by Equation 2 below:

$$P_{down} = \frac{T_3 - T_4}{(T_1 - T_2) + (T_3 - T_4)} \times iV \qquad \text{[Equation 2]}$$

wherein in Equation 2 above, $P_{down}$ denotes an amount of heat applied to a battery cell in a downward direction, $T_1$ denotes a temperature of one surface facing a hot plate of a measuring plate placed on a top of the hot plate, $T_2$ denotes a temperature of the other surface facing the battery cell of the measuring plate placed on the top of the hot plate, $T_3$ denotes a temperature of one surface facing the hot plate of the measuring plate disposed under the hot plate, $T_4$ denotes a temperature of the other surface facing the battery cell of the measuring plate placed under the hot plate, i denotes a current applied to the hot plate, and V denotes a voltage applied to the hot plate.

4. The method of claim 1, wherein the thermal conductivity in the upward direction of the battery cell is calculated by Equation 3 below:

$$k_{up} = \frac{P_{up} \times L_{top}}{A \times (T_H - T_C)} \qquad \text{[Equation 3]}$$

wherein in Equation 3, $k_{up}$ denotes a vertical thermal conductivity from a bottom to a top of a battery cell, $P_{up}$ denotes an amount of heat applied to the battery cell in an upward direction, $L_{top}$ denotes a thickness of a battery cell, A denotes a unit area for measuring an amount of heat, $T_H$ denotes a temperature at a bottom of a battery cell close to a hot plate, and $T_C$ denotes a temperature at a top of a battery cell close to a cooling plate.

5. The method of claim 1, wherein the thermal conductivity in the downward direction of the battery cell is calculated by Equation 4 below:

$$k_{down} = \frac{P_{down} \times L_{bottom}}{A \times (T'_H - T'_C)} \qquad \text{[Equation 4]}$$

wherein in Equation 4, $k_{down}$ denotes a vertical thermal conductivity from a top to a bottom of a battery cell, $P_{down}$ denotes an amount of heat applied to the battery cell in a downward direction, $L_{bottom}$ denotes a thickness of a battery cell, A denotes a unit area for measuring an amount of heat, $T'_H$ denotes a temperature at a top of a battery cell close to a hot plate, and $T'_C$ denotes a temperature at a bottom of a battery cell close to a cooling plate.

\* \* \* \* \*